United States Patent
Yu et al.

(10) Patent No.: US 8,033,883 B2
(45) Date of Patent: Oct. 11, 2011

(54) PROCESS FOR FORMING AN ORGANIC ELECTRONIC DEVICE

(75) Inventors: Gang Yu, Santa Barbara, CA (US); Nugent Truong, Ventura, CA (US)

(73) Assignees: E.I. du Pont de Nemours and Company, Wilmington, DE (US); Dupont Displays Inc, Wilmington, DE (US)

( * ) Notice: Subject to any disclaimer, the term of this patent is extended or adjusted under 35 U.S.C. 154(b) by 134 days.

(21) Appl. No.: 12/324,047

(22) Filed: Nov. 26, 2008

(65) Prior Publication Data

US 2009/0081914 A1 Mar. 26, 2009

Related U.S. Application Data

(62) Division of application No. 10/917,990, filed on Aug. 12, 2004, now Pat. No. 7,477,013.

(51) Int. Cl.
*H01J 9/00* (2006.01)
(52) U.S. Cl. .......................................... 445/24; 313/504
(58) Field of Classification Search .......... 313/498–512; 445/24–25
See application file for complete search history.

(56) References Cited

U.S. PATENT DOCUMENTS

| | | | |
|---|---|---|---|
| 3,201,633 A | 8/1965 | Lieb | 428/201 |
| 4,356,429 A | 10/1982 | Tang | 313/503 |
| 5,660,573 A | 8/1997 | Butt | 445/24 |
| 5,902,688 A | 5/1999 | Antoniadis et al. | 428/690 |
| 6,099,980 A | 8/2000 | Schoo et al. | 428/690 |
| 6,225,740 B1 | 5/2001 | Tucker et al. | 313/506 |
| 6,280,909 B1 | 8/2001 | Gill et al. | 430/317 |
| 6,399,222 B2 | 6/2002 | Arai et al. | 428/690 |
| 6,416,885 B1 | 7/2002 | Towns et al. | 428/690 |
| 6,501,218 B1 | 12/2002 | Duggal et al. | 313/510 |
| 6,566,807 B1 | 5/2003 | Fujita et al. | 313/506 |
| 6,855,384 B1 | 2/2005 | Nirmal et al. | 428/32.6 |
| 7,064,483 B2 | 6/2006 | Ottermann et al. | 313/504 |
| 2001/0004190 A1 | 6/2001 | Nishi et al. | 313/506 |
| 2002/0024298 A1 | 2/2002 | Fukunaga | 313/506 |
| 2002/0024808 A1 | 2/2002 | Suehiro et al. | 362/245 |
| 2002/0039001 A1 | 4/2002 | Nagai et al. | 313/512 |
| 2002/0067125 A1 | 6/2002 | Nogaki et al. | 313/510 |
| 2002/0185967 A1* | 12/2002 | Friend | 313/504 |
| 2003/0015961 A1* | 1/2003 | Yamazaki | 313/504 |
| 2003/0068574 A1* | 4/2003 | Shiraki et al. | 430/270.1 |
| 2004/0164674 A1* | 8/2004 | Ottermann et al. | 313/506 |

FOREIGN PATENT DOCUMENTS

EP 1 229 561 A1 8/2002

OTHER PUBLICATIONS

Co-pending U.S. Appl. No. 10/917,990, filed Aug. 12, 2004, Yu et al.
Co-pending U.S. Appl. No. 11/447,211, c-i-p of U.S. Appl. No. 10/917,990 Non-Final Action Mailed Sep. 29, 2008, filed Jun. 5, 2006, Yu et al.

* cited by examiner

*Primary Examiner* — Anne M Hines

(57) ABSTRACT

An organic electronic device includes a first electrode layer, an organic resistive layer coupled to the first electrode layer wherein the organic resistive layer defines at least three regions, an organic active layer coupled to the organic resistive layer, and a second electrode layer coupled to the organic active layer. Each of the at least three regions is characterized by one of the plurality of resistances and the plurality of resistances includes at least three discrete resistances that are different from one another. The regions can be fabricated by selectively exposing portions of the organic resistive layer to a chemical, selectively removing portions of the organic resistive layer, or depositing a plurality of blends.

14 Claims, 1 Drawing Sheet

PROCESS FOR FORMING AN ORGANIC ELECTRONIC DEVICE

RELATED APPLICATION DATA

This application is a division of U.S. application Ser. No. 10/917,990, filed on Aug. 12, 2004, now allowed.

FIELD OF THE INVENTION

The invention relates generally to organic electronic devices and methods for forming organic electronic devices.

BACKGROUND INFORMATION

Organic electronic devices have attracted increasing attention in recent years. Examples of organic electronic devices include organic light emitting diodes ("OLEDs"). A typical OLED includes an electroluminescent organic active layer between two electrodes, where at least one of the electrodes is transparent.

Static graphic displays using organic light emitting diode arrays have been constructed by patterning one of the electrode layers. In this approach, a transparent indium tin oxide layer electrode has been patterned. However, in this approach, the patterned electrode display permits only two states (i.e., on or off) based on whether the electrode is present or absent across an area of interest. This two-states (on or off) constraint limits the resolution and the quality of the image.

Organic light emitting diode arrays have also been constructed by patterning the electroluminescent layer. In this approach, a polyaniline layer has been patterned. However, as with the previous approach, this display, with a patterned electroluminescent layer, still permits only two states (i.e., on or off). Again, the two-states constraint limits the resolution and the quality of the image.

Organic light emitting diode arrays have also been constructed by patterning an organic insulating layer with apertures. The apertures permit electronic contact with the exposed electroluminescent layer. However, yet again, the patterned insulating layer display still permits only two states (i.e., on or off). Again, the two-states constraint limits the resolution and quality of the image.

Consequently, there is an unmet need for inexpensive displays, announcement boards and badges with fixed images and/or graphic information using light emitting diodes with gray-scale (multistate) capability to improve resolution and quality of the image without increasing costs. Therefore, what is needed is a new approach to producing an inexpensive static graphic display that provides a gray-scale (multistate) capability.

SUMMARY OF THE INVENTION

Provided is an organic electronic device that includes a first electrode layer, an organic resistive layer coupled to the first electrode layer, wherein the organic resistive layer defines at least three regions, an organic active layer coupled to the organic resistive layer, and a second electrode layer coupled to the organic active layer. Each of the at least three regions is characterized by one of a plurality of resistances and the plurality of resistances includes at least three discrete resistances that are different from one another.

Also provided is a method of fabricating an organic electronic device includes forming a first electrode layer, forming an organic resistive layer on the first electrode, selectively exposing the organic resistive layer to a chemical, wherein, after selectively exposing the organic resistive layer, i) the selectively exposed organic resistive layer defines at least three regions, ii) each of the at least three regions is characterized by one of a plurality of resistances and iii) the plurality of resistances includes at least three discrete resistances that are different from one another, forming an organic active layer on the selectively exposed organic resistive layer, and forming a second electrode on the organic active layer.

Another method of fabricating an organic electronic device is provided and this method includes forming a first electrode layer, forming an organic resistive layer on the first electrode, selectively removing a portion of the organic resistive layer, wherein a remainder of the organic resistive layer remains on the first electrode after selectively removing the portion, forming an organic active layer on the selectively exposed organic resistive layer; and forming a second electrode on the organic active layer, wherein i) the remainder of the organic resistive layer defines at least three regions, ii) each of the at least three regions is characterized by one of a plurality of resistances and iii) the plurality of resistances includes at least three resistances that are different from one another.

Another method of fabricating an organic electronic device is provided and this method includes forming a first electrode layer, forming an organic resistive layer on the first electrode by depositing a plurality of blends, wherein i) the organic resistive layer defines at least three regions, ii) each of the at least three regions is characterized by one of a plurality of resistances and iii) the plurality of resistances includes at least three discrete resistances that are different from one another, forming an organic active layer on the selectively exposed organic resistive layer, and forming a second electrode on the organic active layer.

The foregoing general description and the following detailed description are exemplary and explanatory only and are not restrictive of the invention, as defined in the appended claims.

BRIEF DESCRIPTION OF THE DRAWINGS

The invention is illustrated by way of example and not limitation in the accompanying figures.

Figure 1:
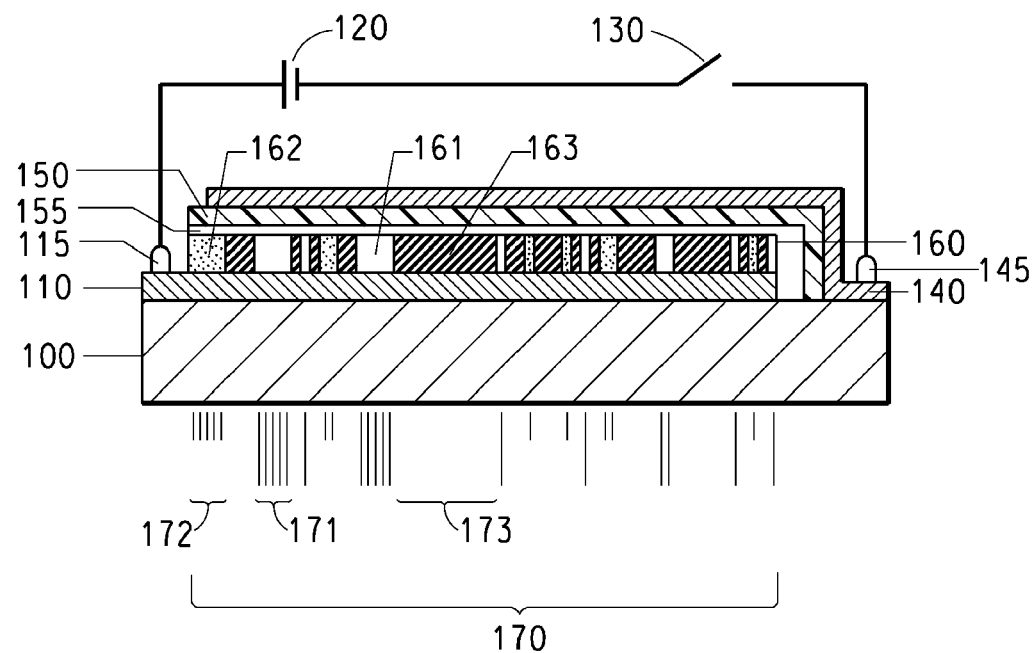
FIG. 1 is a schematic structural view of an organic light emitting diode array having a organic resistive layer defining three regions based on composition, representing an embodiment of the invention.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

In one embodiment of the invention, an organic electronic device includes a first electrode layer, an organic resistive layer coupled to the first electrode layer, wherein the organic resistive layer defines at least three regions, an organic active layer coupled to the organic resistive layer, and a second electrode layer coupled to the organic active layer. Each of the at least three regions is characterized by one of a plurality of resistances and the plurality of resistances includes at least three discrete resistances that are different from one another.

In another embodiment of the invention, a method of fabricating an organic electronic device includes forming a first electrode layer, forming an organic resistive layer on the first electrode, selectively exposing the organic resistive layer to a chemical, wherein, after selectively exposing the organic resistive layer, i) the selectively exposed organic resistive layer defines at least three regions, ii) each of the at least three regions is characterized by one of a plurality of resistances and iii) the plurality of resistances includes at least three discrete resistances that are different from one another, forming an organic active layer on the selectively exposed organic resistive layer, and forming a second electrode on the organic active layer.

In another embodiment of the invention, a method of fabricating an organic electronic device includes forming a first electrode layer, forming an organic resistive layer on the first electrode, selectively removing a portion of the organic resistive layer, wherein a remainder of the organic resistive layer remains on the first electrode after selectively removing the portion, forming an organic active layer on the selectively exposed organic resistive layer; and forming a second electrode on the organic active layer, wherein i) the remainder of the organic resistive layer defines at least three regions, ii) each of the at least three regions is characterized by one of a plurality of resistances and iii) the plurality of resistances includes at least three resistances that are different from one another.

In another embodiment of the invention, a method of fabricating an organic electronic device includes forming a first electrode layer, forming an organic resistive layer on the first electrode by depositing a plurality of blends, wherein i) the organic resistive layer defines at least three regions, ii) each of the at least three regions is characterized by one of a plurality of resistances and iii) the plurality of resistances includes at least three discrete resistances that are different from one another, forming an organic active layer on the selectively exposed organic resistive layer, and forming a second electrode on the organic active layer.

Other features and advantages of the invention will be apparent from the following detailed description, and from the claims. The detailed description first addresses Definitions and Clarification of Terms followed by Structure of the Organic Electronic Device, Formation of the Organic Resistive Layer, Advantages, and finally Examples.

1. Definitions and Clarification of Terms

Before addressing details of embodiments described below, some terms are defined or clarified. The terms "region" and "regions" are intended to mean areas or volumes characterized by one or more properties having one or more states, either discrete, overlapping or coincident. One region is distinct from another region if one property has two or more states and those two or more states are discrete or overlapping, but not coincident.

As used herein, the term "active" when referring to a layer or material is intended to mean a layer or material that exhibits electronic or electro-radiative properties. An active layer material may emit radiation or exhibit a change in concentration of electron-hole pairs when receiving radiation.

The terms "array," "peripheral circuitry," and "remote circuitry" are intended to mean different areas or components of an electronic device. For example, an array may include a number of pixels, cells, or other structures within an orderly arrangement (usually designated by columns and rows). The pixels, cells, or other structures within the array may be controlled locally by peripheral circuitry, which may lie on the same substrate as the array but outside the array itself. Remote circuitry typically lies away from the peripheral circuitry and can send signals to or receive signals from the array (typically via the peripheral circuitry). The remote circuitry may also perform functions unrelated to the array. The remote circuitry may or may not reside on the substrate having the array.

The term "continuous" when referring to a layer is intended to mean a layer that covers an entire substrate or portion of a substrate (e.g., the array) without any breaks in the layer. Note that a continuous layer may have a portion that is locally thinner than another portion and still be continuous if there is no break or gap in the layer.

The term "electrical insulator" and its variants are intended to mean a material, layer, member, or structure having an electrical property such that it substantially prevents any significant current from flowing through such material, layer, member, or structure.

The term "liquid deposition" includes any continuous or discontinuous method of depositing a material that is in the form of a liquid (which can be a solution, dispersion, emulsion or suspension). Liquid deposition techniques include, but are not limited to, continuous deposition techniques such as spin coating, gravure coating, curtain coating, dip coating, slot-die coating, casting, spray-coating, bar coating, roll coating, doctor blade coating and continuous nozzle coating; and discontinuous deposition techniques such as ink jet printing, gravure printing, and screen printing.

The term "resistive" when referring to a material is intended to mean a material having an electrical resistance between that of an electrical conductor and an electrical insulator. Thus, an "organic resistive layer" is intended to mean a layer including organic material, the layer typically having a resistively in a range of from approximately $10^{-3}$ to approximately $10^{+9}$ ohm·cm. The organic resistive layer can be a blend and/or composite of one or more organic and/or one or more inorganic materials. For example, one embodiment of the invention can include an organic resistive layer having a resistivity in a range of from approximately $10^{-2}$ to approximately $10^{+7}$ ohm·cm. In another embodiment of the invention, an organic resistive layer can have a resistivity in a range of from approximately $10^{-2}$ to approximately $10^{+5}$ ohm·cm. In still another embodiment of the invention, an organic resistive layer can have a resistivity of from approximately $10^{-2}$ to approximately $10^{+4}$ ohm·cm.

The term "organic electronic device" is intended to mean a device including one or more organic semiconductor layers or materials. Organic electronic devices include: (1) devices that convert electrical energy into radiation (e.g., a light-emitting diode, light emitting diode display, diode laser, or lighting panel), (2) devices that detect signals through electronic processes (e.g., photodetectors (e.g., photoconductive cells, photoresistors, photoswitches, phototransistors, phototubes), IR detectors), (3) devices that convert radiation into electrical energy (e.g., a photovoltaic device or solar cell), and (4) devices that include one or more electronic components that include one or more organic semiconductor layers (e.g., a transistor or diode).

The term "passive matrix" is intended to mean an array of electronic components, wherein the array does not have any driver circuits.

The term "active matrix" is intended to mean an array of electronic components and corresponding driver circuits within the array.

The term "substrate" is intended to mean a workpiece that can be either rigid or flexible and may be include one or more layers of one or more materials, which can include, but are not limited to, glass, polymer, metal or ceramic materials or combinations thereof.

The term "plurality" is intended to mean two or more than two. The term "another" is intended to mean at least a second or more. The terms "consisting" (consists, consisted) and/or "composing" (composes, composed) are intended to mean close language that does not leave the recited method, apparatus or composition to the inclusion of procedures, structure(s) and/or ingredient(s) other than those recited except for ancillaries, adjuncts and/or impurities ordinarily associated therewith. The recital of the term "essentially" along with the terms "consisting" (consists, consisted) and/or "composing" (composes, composed), is intended to mean modified close language that leaves the recited method, apparatus and/or composition open only for the inclusion of unspecified procedure(s), structure(s) and/or ingredient(s) which do not materially affect the basic novel characteristics of the recited method, apparatus and/or composition. The term "coupled" is intended to mean connected, although not necessarily directly, and not necessarily mechanically. The term "any" is intended to mean all applicable members of a set or at least a subset of all applicable members of the set. The term "approximately" is intended to mean at least close to a given value (e.g., within 10% of). The term "substantially" is intended to mean largely but not necessarily wholly that which is specified. The term "generally" is intended to mean at least approaching a given state. The term "deploying" is intended to mean designing, building, shipping, installing and/or operating. The term "means" when followed by the term "for" as used herein, is defined as hardware, firmware and/or software for achieving a result.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Group numbers corresponding to columns within the Periodic Table of the elements use the "New Notation" convention as seen in the CRC Handbook of Chemistry and Physics, 81$^{st}$ Edition (2000).

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductor arts.

2. Structure of the Organic Electronic Device

To meet the need for displays, announcement boards, badges with fixed images and/or graphic information, one illustrative embodiment of the invention can include an organic active layer (e.g., in the context of an organic light emitting diode) with non patterned electrodes and a patterned organic resistive layer. In one embodiment of the invention, the organic resistive layer includes three or more regions characterized by different resistances that are a function of composition. In another embodiment of the invention, the organic resistive layer includes three or more regions characterized by different resistances that are a function of thickness.

Referring to FIG. 1, a substrate 100 provides the initial base material for the device. A first electrode 110 is coupled to the substrate 100. A first electrode contact 115 is coupled to the first electrode 110. A power supply 120 is coupled to the first electrode contact 115. A switch 130 is electrically coupled to the power supply 120. A second electrode 140 is coupled to the switch 130 via a second electrode contact 145. An organic active layer 150 is coupled to the second electrode 140. An optional charge-transfer layer can be coupled between the second electrode 140 and the organic active layer 150. An organic resistive layer 160 is coupled between the organic active layer 150 and the first electrode 110. An optional charge-transfer layer can be coupled between the first electrode 110 and the organic resistive layer 160. An optional charge-transfer layer 155 can also be coupled between the organic resistive layer 160 and the organic active layer 150. A semi-insulating polymer layer is an example of an organic resistive layer 160 and the invention is not limited to semi-insulating polymer materials with regard to the organic resistive layer 160.

It is important to note that the organic resistive layer 160 can be located between the cathode and the organic active layer and/or located between the anode and the organic active layer. The anode can be referred to as a first electrode and the cathode referred to as the second electrode, or alternatively the anode can be referred to as a second electrode and the cathode can be referred to as the first electrode; the terms first and second being merely for identification. It is also important to note that the organic active layer can transmit electromagnetic radiation (e.g., light) through the anode and/or through the cathode.

With respect to the embodiment depicted in FIG. 1, the organic resistive layer 160 includes three regions defining three separate resistances. The three regions include a first region 161, a second region 162 and a third region 163. The first region 161 is indicated in FIG. 1 with the lightest of three shadings. The first region 161 is characterized by the lowest of the three resistances. The second region 162 is denoted in FIG. 1 by the intermediate shading. The second region 162 is characterized by the intermediate of the three resistances. The third region 163 is indicated in FIG. 1 by the darkest of the three shadings. The third region 163 is characterized by the highest of the three resistances. It is important to note that the three different resistances can be discreet or overlapping, provided that they are not coincident with one another.

With respect to the embodiment depicted in FIG. 1, an emitted pattern 170 includes light from all three of the regions. Light from all three of the regions includes a portion of pattern emitted from the first region 171, a portion of pattern emitted from second region 172 and a portion of pattern emitted from third region 173. The scale or length of the vertically arranged bars toward the bottom of FIG. 1 represents the amplitude of light emitted in the overall emitted pattern 170 and, therefore, in the three different portions 171, 172, 173. It can be appreciated that the portion of pattern emitted from first region 171 has the highest amplitude corresponding to the lowest resistance possessed by the first region 161. Similarly, it can be appreciated that the amplitude of the portion of pattern emitted from the second region 172 has an intermediate amplitude corresponding to the intermediate resistance that is possessed by the second region 162. Similarly, it can be appreciated that the portion of pattern emitted from third region 173 has the lowest amplitude corresponding to the highest resistance possessed by the third region 163.

Figure 2:
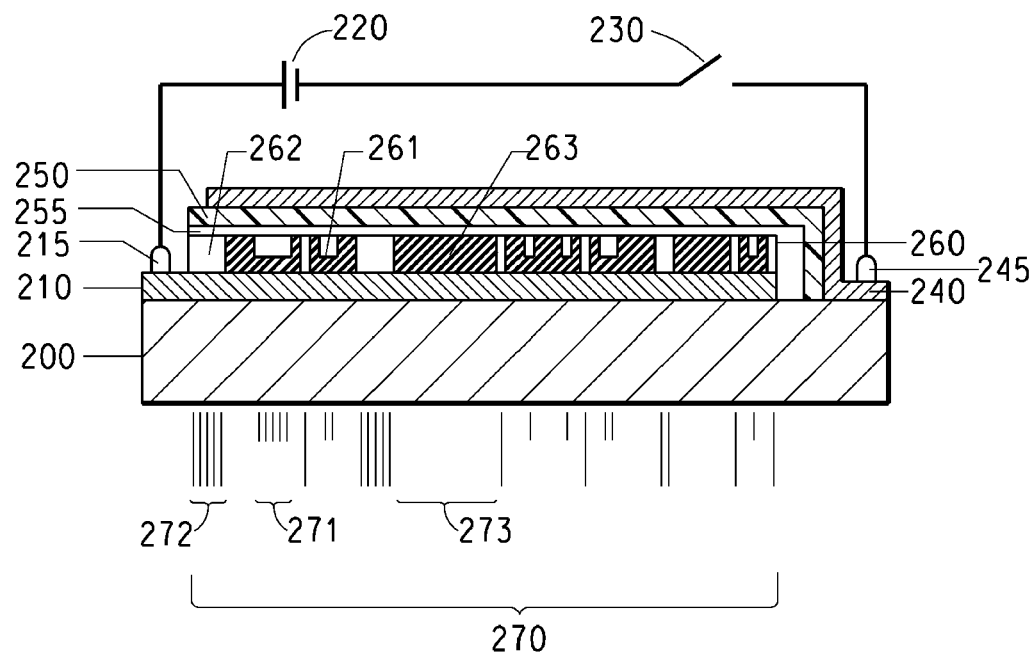
FIG. 2 is a schematic structural view of another organic light emitting diode array having an organic resistive layer defining three regions based on thickness, representing an embodiment of the invention.

Referring to FIG. 2, in another embodiment, a substrate 200 provides the initial base material for the device. An anode 210 is coupled to the substrate 200. An anode contact 215 is coupled to the anode 210. A power supply 220 is coupled to the anode contact 215. A switch 230 is electrically coupled to the power supply 220. A cathode 240 is coupled to the switch 230 via a cathode contact 245. An organic active layer 250 is coupled to the cathode 240. An optional charge-transfer layer can be coupled between the cathode 240 and the organic active layer 250. An organic resistive layer 260 is coupled between the organic active layer 250 and the anode 210. An optional charge-transfer layer can be coupled between the anode 210 and the organic resistive layer 260. An optional charge-transfer layer 255 can be coupled between the organic resistive layer 260 and the organic active layer 250.

With respect to the embodiment depicted in FIG. 2, the organic resistive layer 260 includes three regions defining three separate resistances. These resistances are proportional to the varying thickness of organic resistive layer 260 across the corresponding regions. The three regions include a first region 261, a second region 262 and a third region 263. The first region 261 is indicated in FIG. 2 with the intermediate thickness. The first region 261 is characterized by the intermediate of the three resistances. The second region 262 is denoted in FIG. 2 by the lowest thickness. The second region 262 is characterized by the lowest of the three resistances. The third region 263 is indicated in FIG. 2 by the highest thickness. The third region 263 is characterized by the highest of the three resistances. It is important to note that the three different resistances can be discreet or overlapping, provided that they are not coincident with one another.

With respect to the embodiment depicted in FIG. 2, an emitted pattern 270 includes light from all three of the regions 261, 262, 263. Light from all three of the regions defining the emitted pattern 270 includes a portion of pattern emitted from the first region 271, a portion of pattern emitted from second region 272 and a portion of pattern emitted from third region 273. Again, the scale or length of the vertically arranged bars toward the bottom of FIG. 2 represents the amplitude of light emitted in the overall emitted pattern 270 and, therefore, in the three different portions 271, 272, 273. It can be appreciated that the portion of pattern emitted from first region 271 has the intermediate amplitude corresponding to the intermediate resistance possessed by the first region 261. Similarly, it can be appreciated that the amplitude of the portion of pattern emitted from the second region 272 has the highest amplitude corresponding to the lowest resistance that is possessed by the second region 262. Similarly, it can be appreciated that the portion of pattern emitted from third region 273 has the lowest amplitude corresponding to the highest resistance possessed by the third region 263.

Although the embodiments depicted in FIGS. 1 and 2 illustrate gray-scale emission patterns with three discrete amplitude levels corresponding to three discrete resistances, this is merely for clarity of presentation. It is very important to note that the invention is not limited to any specific number of gray-scale states (shades). The invention can include 3, 4, 5, 6, 8, or more grayscale shades (e.g., 16, 32, 64, 128, 256, etc.).

The anode is an electrode that is more efficient for injecting holes compared to the cathode layer. The anode can include materials containing a metal, mixed metal, alloy, metal oxide or mixed-metal oxide. Suitable metals include the Group 11 metals, the metals in Groups 4, 5, and 6, and the Group 8-10 transition metals. If the anode layer is to be light transmitting, mixed-metal oxides of Groups 12, 13 and 14 metals, such as indium-tin-oxide, may be used. Some non-limiting, specific examples of materials for anode layer include indium-tin-oxide ("ITO"), aluminum-tin-oxide, gold, silver, copper, nickel, and selenium. The anode may also comprise an organic material such as polyaniline.

The cathode is an electrode that is particularly efficient for injecting electrons or negative charge carriers. The cathode layer can be any metal or nonmetal having a lower work function than the first electrical contact layer (in this case, the anode layer). Materials for the second electrical contact layer can be selected from alkali metals of Group 1 (e.g., Li, Na, K, Rb, Cs,), the Group 2 (alkaline earth) metals, the Group 12 metals, the rare earths, the lanthanides (e.g., Ce, Sm, Eu, or the like), and the actinides. Materials such as aluminum, indium, calcium, barium, yttrium, and magnesium, and combinations, may also be used. Specific non-limiting examples of materials for the cathode layer include barium, lithium, cerium, cesium, europium, rubidium, yttrium, magnesium, and samarium.

Each of the electrodes may be formed by a chemical or physical vapor deposition process or a liquid deposition process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, e-beam evaporation and resistance evaporation. Specific forms of physical vapor deposition include RF magnetron sputtering or inductively-coupled plasma physical vapor deposition ("ICP-PVD"). These deposition techniques are well known within the semiconductor fabrication arts.

The organic active layer can include any organic electroluminescent ("EL") material including, but not limited to, fluorescent dyes, fluorescent and phosphorescent metal complexes, conjugated polymers, and mixtures thereof. Examples of fluorescent dyes include, but are not limited to, pyrene, perylene, rubrene, derivatives thereof, and mixtures thereof. Examples of metal complexes include, but are not limited to, metal chelated oxinoid compounds, such as tris(8-hydroxyquinolato)aluminum ($Alq_3$); cyclometalated iridium and platinum electroluminescent compounds, such as complexes of iridium with phenylpyridine, phenylquinoline, or phenylpyrimidine ligands as disclosed in Published PCT Application WO 02/02714, and organometallic complexes described in, for example, published applications US 2001/0019782, EP 1191612, WO 02/15645, and EP 1191614; and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly (phenylenevinylenes), polyfluorenes, poly(spirobifluorenes), polythiophenes, poly(p-phenylenes), copolymers thereof, and mixtures thereof.

The organic active layer can be formed using one or more of any number of different techniques including but not limited to liquid deposition, vapor deposition (chemical or physical), thermal transfer, or any combination thereof.

The organic resistive layer can include semiconductive polymers such as polyaniline, poly(3,4-ethylenedioxythiophene) and/or tetrathiafulvalene tetracyanoquinodimethane (or the like); and the product(s) of reaction(s) between a chemical such as an alcohol, a ketone, an organic acid, an aldehyde, an amine and/or an amide (or the like) and polyaniline, poly(3,4-ethylenedioxythiophene) and/or tetrathiafulvalene tetracyanoquinodimethane (or the like). In some embodiments, the organic resistive layer includes polyaniline and/or poly(3,4-ethylenedioxythiophene); and the product(s) of reaction(s) between acetone and/or propanol and the polyaniline and/or poly(3,4-ethylenedioxythiophene). Alternatively, the organic resistive layer can include carbon/phenolic compositions, carbon/epoxy compositions and/or carbon/polyimide compositions. These alternative compositions can have resistivity in the range of from approximately 1 ohms/square to approximately 0.1 megaohms/square.

The organic resistive layer can include organometallic molecules such as Alq, $Alq_3$, or other metal-chelate ($M-L_3$) type organometallic molecules, such as copper phthalocyanine, copper naphthalocyanine and their substituted derivatives. A desired conductivity can be achieved, for example, by doping with different metal atoms.

The organic resistive layer can also include inorganic semiconductors such as SiC and GaN. A desired conductivity can be achieved, for example, by doping with a mix-valance metal such as aluminum to form Al-doped GaN or Al-doped SiC.

The organic resistive layer can also include inorganic semiconductor particles or metal particles dispersed into an organic binder material to form inorganic/organic composite films. Examples of these particles include silver, gold, ZnS, and InO. The organic binder material could any of the organic materials mentioned above or other well known semiconducting or insulating polymers.

The organic resistive layer can also include ionic conductors (such as Li-doped polyethylene oxide) or solid-state electrolytes that are well known to skilled artisans. More examples of such materials can be found in U.S. Pat. Nos. 5,682,043 and 5,895,717.

Alternatively, the organic resistive layer can be made with a combination of the materials listed above. In one embodiment, the organic resistive layer has resistivities in the range from approximately 1 ohms/square to approximately 0.1 megaohms/square.

The organic resistive layer can be formed using one or more of any number of different techniques including but not limited to liquid deposition, vapor deposition (chemical or physical), thermal transfer, or any combination thereof.

In one embodiment, the device may include a support or substrate that can be adjacent to the anode layer or the cathode layer. In one embodiment, the support is adjacent the anode layer. In one OLED embodiment, if the support is on the side of the display from which the images are to be viewed, then the support should be light transmitting. The support can be flexible or rigid, organic or inorganic. Generally, glass or flexible organic films are used as a support. When the support is an organic film, it may include one or more additional layers to provide environmental protection, such as thin layers of metals, ceramics, or glasses.

In one embodiment, the device may include a charge transport layer between the organic resistive layer and the anode that facilitates hole injection and/or transport. Examples of materials which may facilitate hole-injection/transport comprise N,N'-diphenyl-N,N'-bis(3-methylphenyl)-[1,1'-biphenyl]-4,4'-diamine (TPD) and bis[4-(N,N-diethylamino)-2-methylphenyl](4-methylphenyl)methane (MPMP); hole-transport polymers such as polyvinylcarbazole (PVK), (phenylmethyl)polysilane, poly(3,4-ethylenedioxythiophene) (PEDOT), and polyaniline (PANI), or the like; electron and hole-transporting materials such as 4,4'-N,N'-dicarbazole biphenyl (BCP); or light-emitting materials with good hole-transport properties such as chelated oxinoid compounds, including $Alq_3$ or the like.

In one embodiment, the device may include a charge transport layer between the organic resistive layer and the organic active layer which facilitates charge injection and/or transport. Examples of materials which may facilitate charge transport between the organic resistive layer and the organic active layer comprise semi-conducting polymers such as polyaniline, poly(3,4-ethylenedioxythiophene) and tetrathiafulvalene tetracyanoquinodimethane; electron and hole-transporting materials such as 4,4'-N,N'-dicarbazole biphenyl (BCP); and the like.

In one embodiment, the device may include a charge transport layer between the organic active layer and the cathode that facilitates electron injection and/or transport. Examples of materials which may facilitate electron-injection/transport comprise metal-chelated oxinoid compounds (e.g., $Alq_3$ or the like); phenanthroline-based compounds (e.g., 2,9-dimethyl-4,7-diphenyl-1,10-phenanthroline ("DDPA"), 4,7-diphenyl-1,10-phenanthroline ("DPA"), or the like); azole compounds (e.g., 2-(4-biphenylyl)-5-(4-t-butylphenyl)-1,3,4-oxadiazole ("PBD" or the like), 3-(4-biphenylyl)-4-phenyl-5-(4-t-butylphenyl)-1,2,4-triazole ("TAZ" or the like); other similar compounds; or any one or more combinations thereof. Alternatively, this layer may be inorganic and comprise BaO, LiF, $Li_2O$, or the like.

The charge transport layer can be formed using one or more of any number of different techniques including but not limited to liquid deposition, vapor deposition (chemical or physical), thermal transfer, or any combination thereof.

In one embodiment, the device may have a cover to provide physical and environmental protection. The cover may be made of any relatively impermeable material such as glass, ceramic, or metal. Alternatively, the cover may be made of polymers, such as parylenes or fluoropolymers, or of polymer composites with metal, glass or ceramic. The cover may be sealed to the support using conventional techniques, such as curable epoxy. In one embodiment, the cover has attached thereto a getter material that absorbs or adsorbs water and/or oxygen. In one embodiment, the getter is a molecular sieve. In a further embodiment, the getter in an inorganic binder is applied to a glass cover and heated to densify and activate, with the heating step is carried out prior to attaching the cover to the display.

In other embodiments, additional layer(s) may be present within organic electronic devices. For example, a layer between the hole-injection/transport layer and the EL layer may facilitate positive charge transport, band-gap matching of the layers, function as a protective layer, or the like. Similarly, additional layers between the EL layer and the electron-injection/transport layer may facilitate negative charge transport, band-gap matching between the layers, function as a protective layer, or the like. Layers that are known in the art can be used. In addition, any of the above-described layers can be made of two or more layers. The choice of materials for each of the component layers may be determined by balancing the goals of providing a device with high device efficiency with the cost of manufacturing, manufacturing complexities, or potentially other factors.

3. Formation of the Organic Resistive Layer

In one embodiment, resistivity of the organic resistive layer can be affected through varying the thickness, selection of the specific material used in the layer (and combinations thereof), as well as by changing the resistivity of the material used in the organic resistive layer by selectively exposing it to selected chemicals that cause the resistivity of such exposed regions to change from their as-deposited resistivity.

In one embodiment, the regions of an organic resistive layer can be fabricated by selectively exposing portions of the organic resistive layer to a chemical. The process of patterning the organic resistance layer by selectively exposing the organic resistance layer to the chemical can be achieved by any number of techniques including, but not limited to, screen printing, ink jet printing, and combinations thereof. Thus, the invention provides a simple approach to fabricate large size, high information content emissive displays.

The number of regions per unit area is limited only by the compositional resolution of the organic resistive layer as affected by the selective treatment of the organic resistive layer by the chemical. It is important to note that the chemical treatment of the organic resistive layer can define resistances (or ranges thereof) across several orders of magnitude. For example, the controlled selective treatment of PEDOT or PANI with acetone or propanol can define regions with discreet resistances across three to four orders of magnitude. This variation can be achieved by controlling the composition of the chemical to which the organic resistive layer is selectively exposed. For example, the variation can be achieved by controlling the concentration of the chemical. For instance, an ink jet head can be used to control the dilution of the chemical with water, or a ratio of two or more chemicals can be controlled. For instance the ratio of acetone to propanol can be altered by region. Alternatively, the controlled variation of resistances in different regions can even be achieved by controlling the amount of time for which the organic resistive material is selectively exposed to the chemical.

In another embodiment, the regions of the organic resistive layer can be fabricated by selectively removing portions of the organic resistive layer. In one illustrative embodiment, an organic resistive layer can be formed by screen printing a carbon/phenolic resistor paste onto a first electrode layer and curing. The organic resistive layer can then be covered with a first lithographic mask having a first set of apertures and dry etched to an initial depth. A second lithographic mask different from the first and having a second set of apertures can then be placed over the organic resistive layer and the organic resistive layer can be dry etched a second time. This process can be repeated any number of times to provide the desired number of gray levels for the final device. Any number of techniques typically used to pattern an organic resistive layer may be used, e.g. dry etching, wet etching, laser ablation, ion beam milling, electron beam evaporation, other patterning technique, or any combination thereof.

In yet another embodiment, the regions of the organic resistive layer can be fabricated by selectively depositing different blends characterized by different ratios of component materials. For instance, the blends can be provided by combining at least two members selected from the group consisting of polyaniline, poly(3,4-ethylenedioxythiophene) and/or tetrathiafulvalene tetracyanoquinodimethane (or the like). The process of depositing the organic resistance layer by selectively applying different blends can be achieved by any number of techniques including but not limited to such as screen printing, thermal transfer, ink jet printing, and combinations thereof. Thus again, the invention provides a simple approach to fabricate large size, high formation content emissive displays.

The number of regions per unit area is limited only by the compositional resolution of the organic resistive layer as affected by the deposition technique utilized. It is important to note that the combination of components to define the blends can define resistances (or ranges thereof) across several orders of magnitude.

The devices shown in FIGS. 1 and 2 can emit light under forward bias of greater than or equal to approximately 2V. A typical image can be generated under forward bias of 3V. Of course, the invention is not limited to these or any other particular operating voltages.

4. Advantages

In the OLED embodiment, the invention can provide static brightness (shading) bias or color bias in the context of a passive matrix display. For example, the invention can be used to provide a darker (or lighter) icon image as part of, or the whole of an organic light emitting diode display.

In one embodiment, the invention can also provide brightness (shading) bias or color bias in the context of an active matrix display. For example, the invention can be used to provide one or more display areas that are always darker (or lighter) than other areas of the display (windowing). For instance, less important information can be displayed in a darker surrounding area while more important information can be displayed in a brighter island (window) area. It is important to note that these brightness biased areas may or may not contain addressed cells (e.g., pixels). This implementation of the invention can provide a significant advantage via cost savings with regard to both fabrication and operation by obviating the need for brightness or color bias addressing circuitry.

In one embodiment, the invention can provide large size displays with high information content, with the significant advantage that these same displays can be made with simple processes such as are used with non-patterned devices. The fabrication processes for devices incorporating the present the invention are compatible with manufacturing techniques of both passive matrix and active matrix displays. Thus, in one embodiment, the invention will broaden the usage of organic light emitting diode manufacture materials. In embodiments of the invention where large size displays are made (e.g., with image feature larger than approximately 20 microns), the organic resistive layer (for example, a semi-insulating polymer) can be made using any number of techniques including, but not limited to, screen printing, thermal transfer, ink-jet printing and combinations thereof. In some embodiments, eliminating the photolithography process may present a cost advantage.

The invention can also provide other useful devices and functions. For example, the invention can be used to provide a one time resistively programmed multistate switch array that is useful in the context of a programmable gate array. In one embodiment, the photolithographic processing is not necessary and this may present a cost savings.

EXAMPLES

The following prophetic examples are meant to illustrate and not limit the scope of the invention.

Example 1

This Example demonstrates selective exposure of an organic resistive layer to varying amounts of a chemical to fabricate a static gray-scale organic light emitting diode array. The result is a device including an organic resistive layer defining a plurality of ionic regions where each of at least three regions are characterized by one of at least three compositions corresponding to discrete resistances that are different from one another.

Referring to FIG. 1, the substrate 100 is 30×30 mm (nominal) glass and the first electrode 110 is indium tin oxide. The organic resistive layer 160 in this experiment is formed by spin-coating a polyaniline layer. Portions of the spin-coated polyaniline that will not form any of the regions 161, 162, 163 are removed by laser ablation. An ink jet head exposes the second region 162 and the third region 163 of the polyaniline to two different ratios of acetone to propanol, while not exposing the first region 161. The organic resistive layer is then rinsed and dried. After the organic resistive layer is completed, a typical light-emitting polymer, Green 1300 Series polyfluorene (Dow Chemical Co., Midland, Mich.) dissolved in 4-methyl anisole at a concentration of approximately 0.65%, is spin-coated onto the organic resistive layer. The optional charge transport layer 155 is omitted in this example. The second electrode 140 is formed by vapor depositing Ba and Al layers on top of the organic active layer 150 under a vacuum of approximately $1 \times 10^{-6}$ torr. The final thickness of the Ba layer is approximately 20 Å; the thickness of the Al layer is approximately 3500 Å

Example 2

This Example demonstrates selective removal of varying amounts of an organic resistive layer to fabricate an organic light emitting diode array. The result is a device including an organic resistive layer defining a plurality of ohmic regions where each of at least three regions are characterized by one of at least three thicknesses that correspond to discrete resistances that are different from one another.

Referring to FIG. 2, the substrate 200 is 30×30 mm (nominal) glass and the anode 210 is indium tin oxide. The organic resistive layer 260 in this experiment is formed by screen printing a carbon/phenolic resistor paste onto the indium tin oxide followed by curing at approximately 150° C. The cured paste is then covered with a lithographic mask having a first set of apertures over the second regions 262 and dry etched to an initial depth. A second set of apertures is then opened in the mask over the first regions 261 and the cured paste in the first regions 261 and the second regions 262 is dry etched. The mask is then removed. After the organic resistive layer 260 is completed, the typical light-emitting polymer, Green 1300 Series polyfluorene (Dow Chemical Co., Midland, Mich.) dissolved in 4-methyl anisole at a concentration of approximately 0.65%, is spin-coated onto the organic resistive layer 260. The optional charge transport layer 255 is omitted in this example. The cathode 240 is formed by vapor depositing Ba and Al layers on top of the organic active layer 250 under a vacuum of approximately $1 \times 10^{-6}$ torr. As in the first example, the final thickness of the Ba layer is approximately 20 Å; the thickness of the Al layer is approximately 3500 Å.

Example 3

This Example demonstrates selective blending of varying amounts of components to define an organic resistive layer to fabricate a static gray-scale organic light emitting diode array. The result is a device including organic resistive layer defining a plurality of electronic regions where each of at least three regions are characterized by one of at least three compositions corresponding to discrete resistances that are different from one another.

Referring to FIG. 1, the substrate 100 is 30×30 mm (nominal) glass and the first electrode 110 is indium tin oxide. The organic resistive layer 160 in this experiment is formed by ink jet printing a range of blended compositions. An ink jet head prints the first region 161, the second region 162 and the third region 163 using three different ratios of polyaniline to poly (3,4-ethylenedioxythiophene) to tetrathiafulvalene tetracyanoquinodimethane. The portions of the organic resistive layer that will not form any of the regions 161, 162, 163 are removed by laser ablation. The organic resistive layer is then rinsed and dried. After the organic resistive layer is completed, a light-emitting polymer, Green 1300 Series polyfluorene (Dow Chemical Co., Midland, Mich.) dissolved in 4-methyl anisole at a concentration of approximately 0.65%, is spin-coated onto the organic resistive layer. Again, the optional charge transport layer 155 is omitted in this example. The second electrode 140 is again formed by vapor depositing Ba and Al layers on top of the organic active layer 150 under a vacuum of approximately $1 \times 10^{-6}$ torr. The final thickness of the Ba layer is about 20 Å; the thickness of the Al layer is about 3500 Å

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense and all such modifications are intended to be included within the scope of invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A method of fabricating an organic electronic device comprising:
    forming a first electrode layer;
    forming an organic resistive layer on the first electrode, wherein the organic resistive layer comprises polyaniline, poly(3,4-ethylenedioxythiophene), tetrathiafulvalene tetracyanoquinodimethane, or combinations thereof;
    selectively exposing the organic resistive layer to a chemical, wherein, after selectively exposing the organic resistive layer, i) the selectively exposed organic resistive layer defines at least three regions, ii) each of the at least three regions is characterized by one of a plurality of resistances and iii) the plurality of resistances includes at least three discrete resistances that are different from one another;
    forming an organic active layer on the selectively exposed organic resistive layer; and
    forming a second electrode on the organic active layer.

2. The method of claim 1, wherein the chemical comprises an alcohol, a ketone, an organic acid, an aldehyde, an amine, an amide, or combinations thereof.

3. The method of claim 1, wherein the chemical comprises acetone, propanol, or combinations thereof.

4. The method of claim 1, wherein selectively exposing includes depositing the chemical on the selectively exposed portions of the organic resistive layer using a liquid deposition technique.

5. The method of claim 4, wherein the liquid deposition technique includes selectively exposing the organic resistive layer to more than one chemical.

6. The method of claim 1, wherein selectively exposing includes:
forming a mask on the organic resistive layer, wherein the mask includes a pattern defining at least one opening through the mask that defines a first portion of the organic resistive layer and the mask overlies a second portion of the organic resistive layer; and
exposing a combination of the mask and first portion of the organic resistive layer to the chemical.

7. A method of forming an organic electronic device comprising:
forming a first electrode layer;
forming an organic resistive layer on the first electrode, wherein the organic resistive layer comprises polyaniline, poly(3,4-ethylenedioxythiophene), tetrathiafulvalene tetracyanoquinodimethane, or combinations thereof;
selectively removing a portion of the organic resistive layer, wherein a remainder of the organic resistive layer remains on the first electrode after selectively removing the portion;
forming an organic active layer on the selectively exposed organic resistive layer; and
forming a second electrode on the organic active layer,
wherein the remainder of the organic resistive layer defines at least three regions, ii) each of the at least three regions is characterized by one of a plurality of resistances and iii) the plurality of resistances includes at least three resistances that are different from one another.

8. The method of claim 7, wherein selectively removing includes:
forming a mask on the organic resistive layer, wherein the mask includes a pattern defining at least one opening through the mask that defines a first area corresponding to the portion of the organic resistive layer and the mask overlies a second area; and
removing the mask.

9. The method of claim 8, further comprising, after selectively removing the portion and before removing the mask,
forming at least one additional opening through the mask that defines a third area corresponding to another portion of the organic resistive layer and the mask overlies a fourth area; and
selectively removing another portion of the organic resistive layer, wherein the remainder of the organic resistive layer remains on the first electrode after selectively removing the another portion.

10. The method of claim 8, further comprising, after selectively removing the portion and before forming the organic active layer,
forming another mask on the organic resistive layer, wherein the another mask includes another pattern defining at least one opening through the another mask that defines a third area corresponding to another portion of the organic resistive layer and the mask overlies a fourth area;
selectively removing another portion of the organic resistive layer, wherein the remainder of the organic resistive layer remains on the first electrode after selectively removing the another portion; and
removing the another mask.

11. The method of claim 7, wherein the organic resistive layer comprises a phenolic, an epoxy, a polyimide, or combinations thereof.

12. The method of claim 7, wherein the selectively removing comprises dry etching, wet etching, electron beam evaporation, ion beam milling, laser ablation, or combinations thereof.

13. A method of fabricating an organic electronic device comprising:
forming a first electrode layer;
forming an organic resistive layer on the first electrode by depositing a plurality of blends, wherein at least one of the plurality of blends comprises polyaniline, poly(3,4-ethylenedioxythiophene), tetrathiafulvalene tetracyanoquinodimethane, or combinations thereof, wherein the organic resistive layer defines at least three regions, ii) each of the at least three regions is characterized by one of a plurality of resistances and iii) the plurality of resistances includes at least three discrete resistances that are different from one another;
forming an organic active layer on the selectively exposed organic resistive layer; and
forming a second electrode on the organic active layer.

14. The method of claim 13, wherein depositing comprises a liquid deposition technique.

* * * * *